(12) United States Patent
Atoh

(10) Patent No.: US 6,560,809 B1
(45) Date of Patent: May 13, 2003

(54) SUBSTRATE CLEANING APPARATUS

(75) Inventor: Koji Atoh, Kanagawa-ken (JP)

(73) Assignee: Ebara Corporation, Tokyo (JP)

( * ) Notice: Subject to any disclaimer, the term of this patent is extended or adjusted under 35 U.S.C. 154(b) by 309 days.

(21) Appl. No.: 09/610,989

(22) Filed: Jul. 6, 2000

(30) Foreign Application Priority Data

Jul. 6, 1999 (JP) .......................................... 11-192321
Jun. 29, 2000 (JP) ...................................... 2000-196683

(51) Int. Cl.[7] .......................... A46B 13/02; B08B 11/00
(52) U.S. Cl. .............................. 15/102; 15/21.1; 15/77; 15/88.3
(58) Field of Search .......................... 15/21.1, 77, 88.3, 15/102

(56) References Cited

U.S. PATENT DOCUMENTS

| 5,729,856 | A | | 3/1998 | Jang et al. |
| 5,937,469 | A | * | 8/1999 | Culkins |
| 5,976,267 | A | | 11/1999 | Culkins et al. |
| 6,092,253 | A | * | 7/2000 | Moinpour |

FOREIGN PATENT DOCUMENTS

| JP | 9-223664 | 8/1997 |
| JP | 10-229040 | 8/1998 |
| JP | 10-229062 | 8/1998 |

* cited by examiner

Primary Examiner—Randall E. Chin
(74) Attorney, Agent, or Firm—Wenderoth, Lind & Ponack, L.L.P.

(57) ABSTRACT

A substrate cleaning apparatus comprises a side surface cleaning member and a peripheral edge cleaning member. The side surface cleaning member includes a cylindrical scrub cleaning body having a cylindrical surface and opposite ends. The cylindrical scrub cleaning body is adapted to be rotated about its axis with the cylindrical surface thereof engaged with a side surface of a substrate to be cleaned to effect scrub cleaning of the side surface. The peripheral edge cleaning member is adapted to be engaged with a peripheral edge of the substrate to effect scrub cleaning of the peripheral edge. The peripheral edge cleaning member is attached to one of the opposite ends of the cylindrical scrub cleaning body so as to be rotated along with the cylindrical scrub cleaning body about the axis of the cylindrical scrub cleaning body. The peripheral edge cleaning member comprises a sponge member adapted to be engaged with and scrub the peripheral edge of the substrate. The cylindrical scrub cleaning body may also be made of a sponge member and integrally formed with the sponge member comprising the peripheral edge cleaning member. The peripheral cleaning member may comprise a plurality of bristles instead of the cylindrical sponge member.

20 Claims, 7 Drawing Sheets

Fig. 1(a)
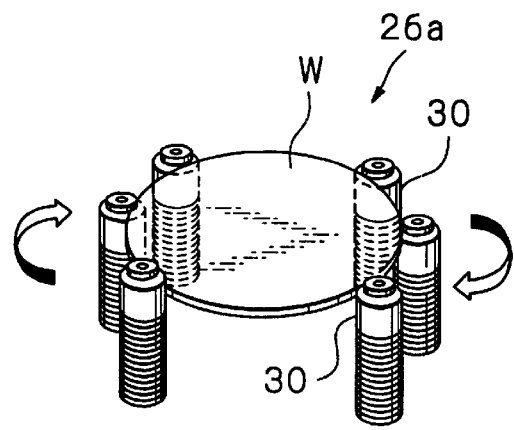
Fig. 1(b)
Fig. 1(c)
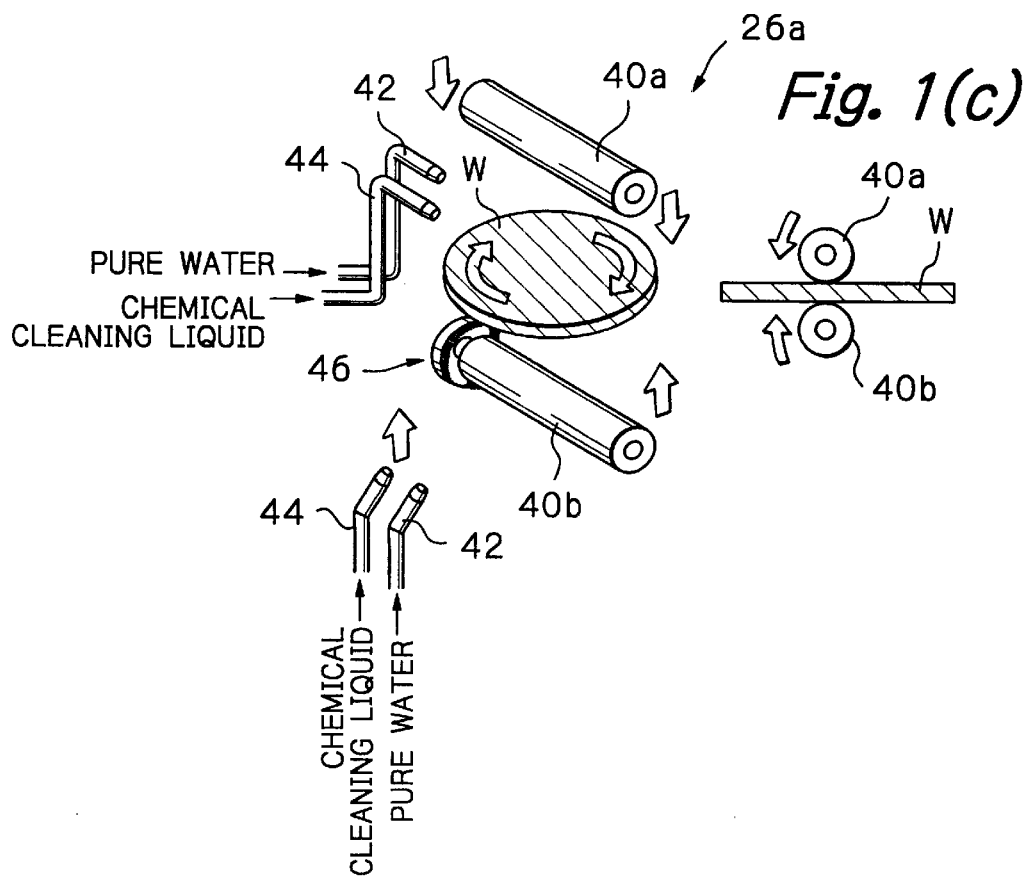

Fig. 6(a) PRIOR ART
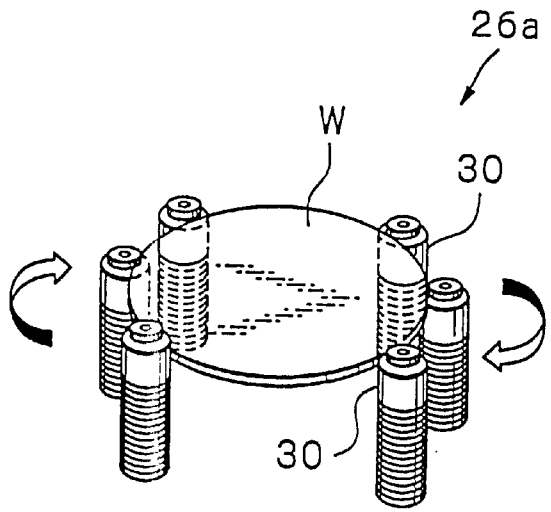
Fig. 6(b) PRIOR ART
Fig. 6(c) PRIOR ART
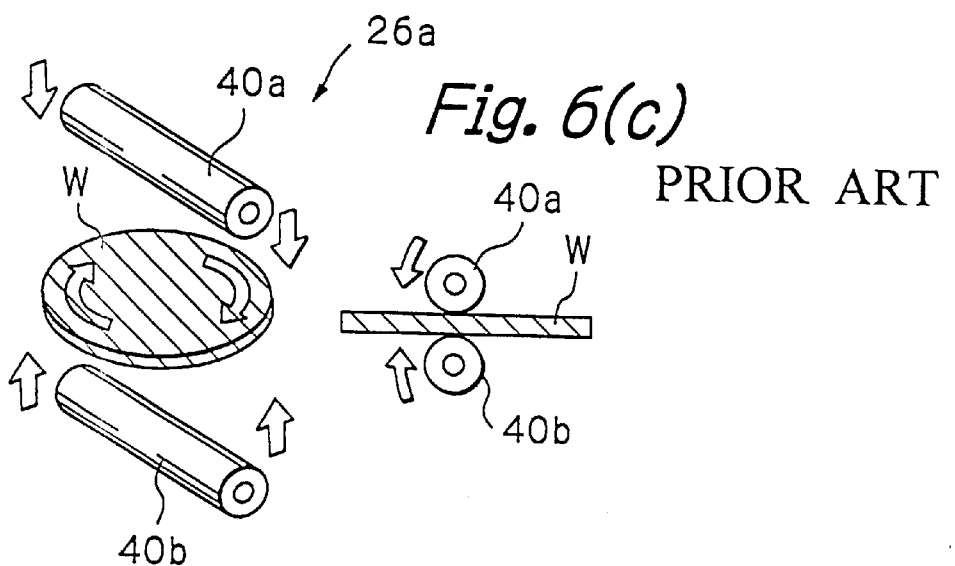

SUBSTRATE CLEANING APPARATUS

BACKGROUND OF THE INVENTION

This invention relates to a cleaning apparatus for cleaning a substrate, such as a semiconductor substrate or wafer and a liquid crystal plate, which are required to have a high degree of cleanliness.

With recent rapid progress in technology for fabricating high-integration semiconductor devices, circuit-wiring patterns have been becoming increasingly fine and, as a result, spaces between wiring patterns have also been decreasing. Especially, in photolithography for formation of wiring patterns with a spacing of less than 0.5 microns, as depth of focus becomes shallower, it is required for an image-formation surface to have an exceptionally high degree of flatness. In addition, it is required for semiconductor substrates to be subjected to fine cleaning in such a manner as to remove sub-micron particles from surfaces on which wiring patterns are to be formed, which particles might otherwise cause short circuits between adjacent wiring patterns. Such fine cleaning is also required in processing a glass substrate to be used as a masking member, a liquid crystal plate or the like.

FIG. 4 illustrates a conventional semiconductor substrate polishing apparatus for conducting fine cleaning as well as planarization or polishing of semiconductors. The apparatus comprises a polishing section 10, a loading/unloading section 22, a transfer section including two transfer machines 24a, 24b, a cleaning section including three cleaning machines 26a, 26b, 26c, and a turning-over machine 28. Semiconductor substrates to be polished are loaded into the loading/unlading section 22 and, then, transferred to the polishing section 10 by transfer machines 24a, 24b. Following completion of polishing in the polishing section 10, the substrate is returned to the loading/unloading section 22 through the cleaning section where the substrate is cleaned by the cleaning machines 26a, 26b, 26c and finally dried.

The transfer machines 24a, 24b may be of a mobile type or of a stationary robot type having articulated arms provided with robot hands. As shown in FIG. 5, the polishing section comprises a turntable 12 provided on its upper surface with a polishing cloth 11, a substrate carrier 13 for holding a substrate W and bringing it into contact with the polishing cloth 11 to subject the substrate W to polishing, and a nozzle 14 for supplying an abrasive slurry Q (for example, when polishing a dielectric layer or oxide film formed over a silicon substrate, a slurry comprising an alkali solution containing abrasive particles of a predetermined size) to the polishing cloth 11 during polishing of the substrate W.

With reference to FIGS. 6(a)–6(c), the first cleaning machine 26a comprises a plurality of upright substrate support rollers 30 which have annular grooves at their upper ends adapted to be engaged with a peripheral edge of a substrate W to hold the substrate in a horizontal state, and which rotate about their own vertical axes to rotate the substrate at a low speed. The first cleaning machine 26a further includes a pair of scrub cleaning rollers 40a, 40b made of a sponge material or the like which are adapted to be engaged with upper and lower surfaces of the substrate W while it is held and rotated by the rollers 30, respectively, to effect scrub polishing of these surfaces. Each of the scrub cleaning rollers 40a, 40b is movable in a vertical direction between a polishing position for effecting the above-stated scrub cleaning, and a retracted position.

With reference to FIG. 8, the second and third cleaning machines 26b and 26c each comprise a disc 36 provided on a top end of a rotational shaft 32, which disc is provided with a plurality of substrate holding arms 34 extending radially outwardly from a peripheral edge of the disc. The holding arms 34 are provided with upright chuck portions 34' at their tip ends for chucking a substrate W. Further, the cleaning machines 26b, 26c comprise a scrub cleaning member 38 made of a sponge material or the like which is provided on a distal end of an arm 37 which is supported at its proximal end on a top end of a pivotal shaft 35, and nozzles 39, 40 for supplying cleaning liquid and pure water, respectively, to the substrate W during polishing thereof.

Upon completion of polishing of a substrate W in the polishing section 10, the cleaning machines 26a, 26b, 26c effect cleaning of the substrate W as follows.

The substrate W is firstly transferred to the first cleaning machine 26a, in which the rollers 30 hold and rotate the substrate about its axis and, simultaneously, the scrub cleaning rollers 40a, 40b engage with the upper and lower surfaces of the substrate, respectively, to remove particles such as abrasive particles and/or substrate debris from these surfaces, while pure water and/or cleaning liquid is supplied to the surfaces.

Following scrub cleaning by the first cleaning machine 26a, the substrate W is transferred successively to the second and third cleaning machines 26b and 26c, where it is held and rotated by chucks 34' at around 100–500 rpm while the scrub cleaning member 38 engages with and sweeps the upper surface of the substrate W, while being rotated about its vertical axis, to thereby effect scrub cleaning of the upper surface. During polishing, the nozzles 39, 40 supply pure water and/or cleaning water, to which mega-sonic vibration may be imparted. Upon completion of the scrub cleaning in the third cleaning machine 26c, speed of rotation of the substrate W is increased to 1500–5000 rpm to effect spin drying of the substrate, while a clean inert gas is supplied around the substrate as required. The dried substrate is thereafter returned to the loading/unloading section 22 by the transfer machine 24b.

As shown in FIG. 4, the polishing apparatus is enclosed in a housing to prevent particles such as abrasive particles and substrate debris from scattering outside the apparatus and, further, the respective sections in the housing including the polishing section 10 and the cleaning section are divided by partition walls which function to prevent particles from being carried to sections other than the polishing section 10. Further, each of the separated sections is preferably provided with an air-conditioning system for generating an air flow flowing around a substrate treated therein in a downward direction to prevent particles including abrasive particles and substrate debris from scattering outside the section.

The apparatus involves a problem in connection with the first cleaning apparatus 26a as follows.

In order to effect scrub cleaning of the entire upper and lower surfaces of a substrate W, the scrub cleaning rollers are brought into contact with the surfaces along a diameter of the substrate in such a manner that, as shown in FIG. 7(a), the scrub cleaning rollers extend, and opposite ends thereof are positioned outside a peripheral edge of the substrate to enable the rollers to engage with the entire opposite side surfaces of the substrate during cleaning. However, as shown in FIG. 7(b), a clearance gap S exists between the upper and lower scrub cleaning rollers 40a and 40b around peripheral edge B of the substrate W and, as a result, the peripheral edge, specifically a bevel portion thereof is unable to be scrub cleaned. If particles such as abrasive particles remain on the peripheral edge due to incomplete cleaning, there is a possibility that these particles will be displaced or distributed to the side surfaces of the substrate and produce defects in the substrate such as short circuits between adjacent wiring patterns.

To solve this problem, there has been proposed a cleaning device designed specifically for cleaning the peripheral edge of a substrate and adapted to be incorporated into a conventional cleaning machine. However, inclusion of such a device causes the polishing apparatus to become complicated in construction and control and expensive in installation and maintenance.

SUMMARY OF THE INVENTION

An object of the present invention is to provide a substrate cleaning apparatus provided with an edge-cleaning device which is simple in construction and easy to control.

In accordance with the present invention, there is provided a substrate cleaning apparatus comprising a side surface cleaning member and a peripheral edge cleaning member. The side surface cleaning member includes a cylindrical scrub cleaning body having a cylindrical surface and opposite ends. The cylindrical scrub cleaning body is adapted to be rotated about its axis with the cylindrical surface thereof engaged with a side surface of a substrate to be cleaned to effect scrub cleaning of the side surface. The peripheral edge cleaning member is adapted to be engaged with a peripheral edge of the substrate to effect scrub cleaning of the peripheral edge.

The peripheral edge cleaning member may be attached to one of the opposite ends, of the cylindrical scrub cleaning body so as to be rotated along with the cylindrical scrub cleaning body about the axis of the cylindrical scrub cleaning body. The peripheral edge cleaning member may comprise a sponge member adapted to be engaged with and scrub the peripheral edge of the substrate. The sponge member may be made of a PVA, a urethane foam or the like. The cylindrical scrub cleaning body may also be made of the same material as the sponge member as stated above and integrally formed with the sponge member.

The side surface cleaning member is adapted to be placed on the side surface of the substrate to be cleaned in such a manner that the axis of the cylindrical cleaning body is parallel to the side surface of the substrate while the end provided with the peripheral edge cleaning member is positioned inside the peripheral edge of the substrate, with the peripheral edge cleaning member positioned outside the peripheral edge and the sponge member thereof engaged with the peripheral edge. The other end of the cylindrical scrub cleaning body is positioned outside the peripheral edge, whereby the entire side surface and the entire peripheral edge of the substrate are able to be to scrub cleaned.

The peripheral edge cleaning member may comprises a plurality of bristles instead of the cylindrical sponge member. The bristles may be made of mohair, fluorine-containing resin or the like.

The above and other objects, features and advantages of the present invention will become more apparent from the following description of the preferred embodiments thereof, taken in conjunction with the accompanying drawings.

BRIEF DESCRIPTION OF THE DRAWINGS

FIG. 1(a) is a perspective view of substrate support rollers used in a cleaning apparatus in accordance with an embodiment of the present invention;

FIG. 1(b) is an exploded perspective view of a main part of the cleaning apparatus;

FIG. 1(c) is a cross-sectional view of upper and lower scrub rollers in operation in the cleaning apparatus;

FIG. 6(a) is a perspective view of substrate support rollers used in a conventional cleaning machine incorporated in the polishing apparatus of FIG. 4;

FIG. 6(b) is an exploded perspective view of a main part of the conventional cleaning machine;

FIG. 6(c) is a cross-sectional view of upper and lower scrub rollers in operation in the conventional cleaning machine of FIG. 6(b);

DETAILED DESCRIPTION OF THE INVENTION

Figure 2A:
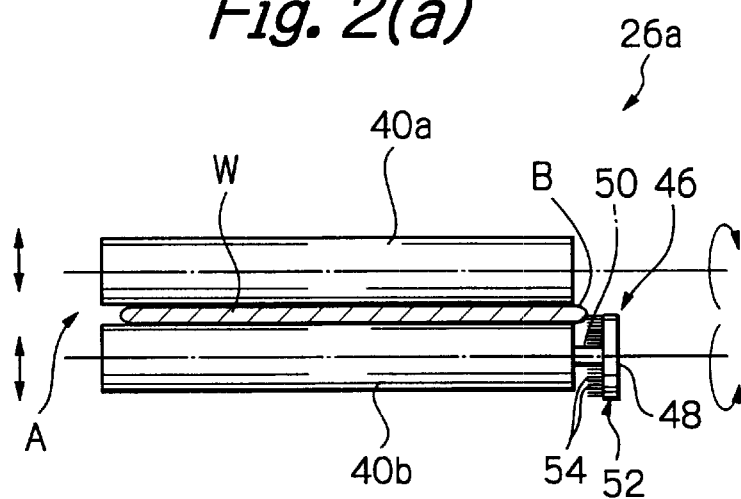
FIG. 2(a) is a side elevational view of the scrub rollers in operation.

Hereinbelow, description is made with regard to embodiments of the present invention, referring to the drawings. In these embodiments, polishing apparatus for semiconductor substrates are taken as examples. However, the present invention is applicable to cleaning of other substrates such as a glass substrate and liquid crystal plate, and is not limited to a semiconductor substrate.

Figure 4:
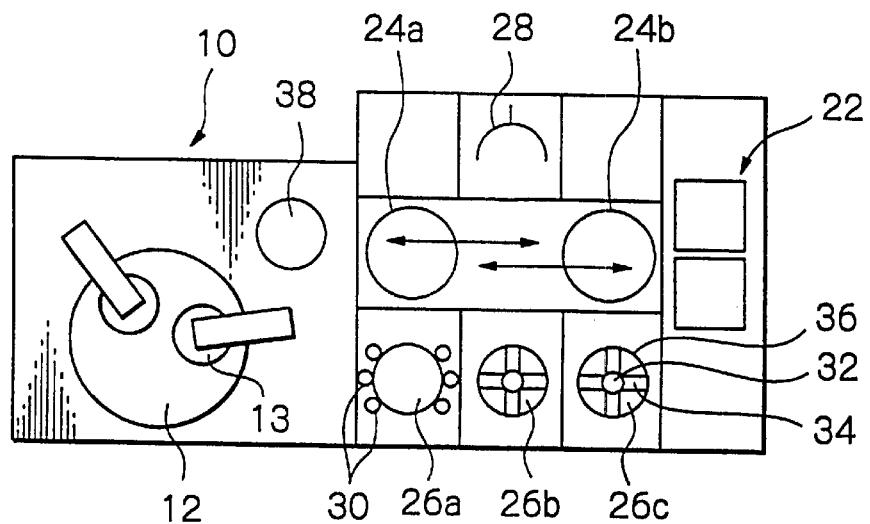
FIG. 4 is a schematic plan view of a conventional polishing apparatus.
Figure 5:
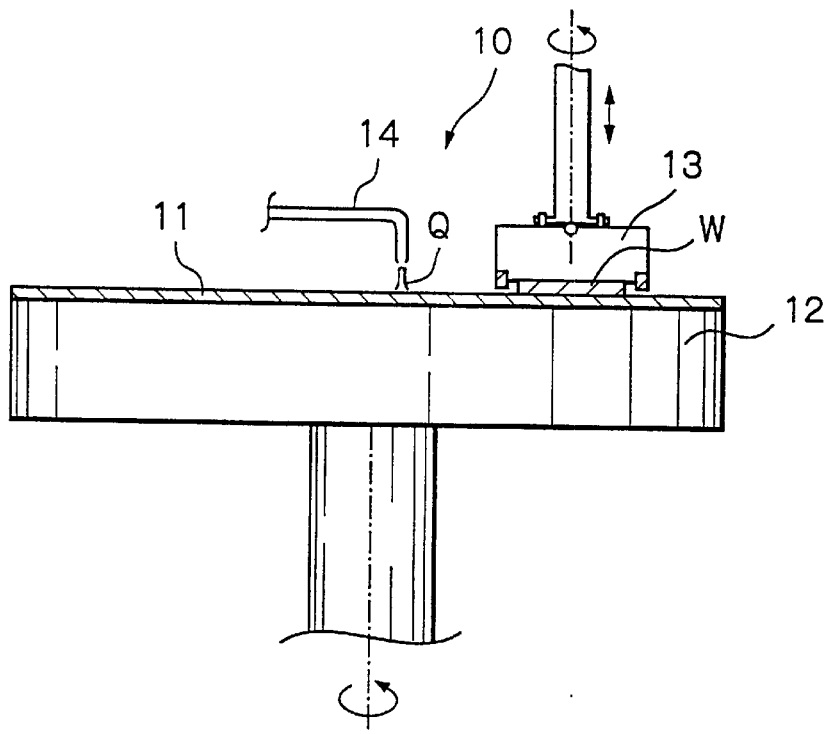
FIG. 5 is a side elevational view of a polishing section in the polishing apparatus of FIG. 4.
Figure 7A:
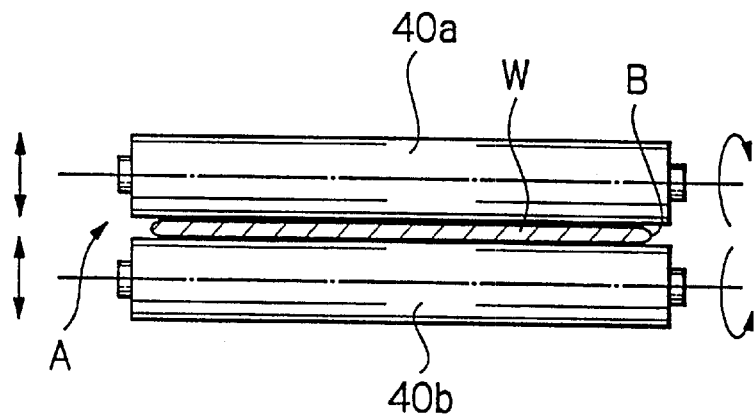
FIG. 7(a) is a side elevational view of the upper and lower scrub rollers of FIG. 6(c)
Figure 7B:
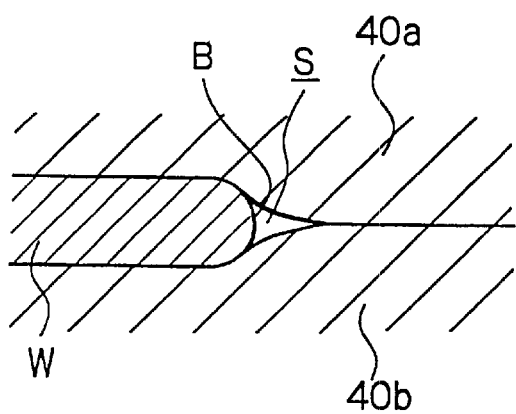
FIG. 7(b) is an enlarged cross-sectional view showing that a peripheral edge of a substrate is not being subject to cleaning by the upper and lower scrub rollers of FIG. 6(c)
Figure 8:
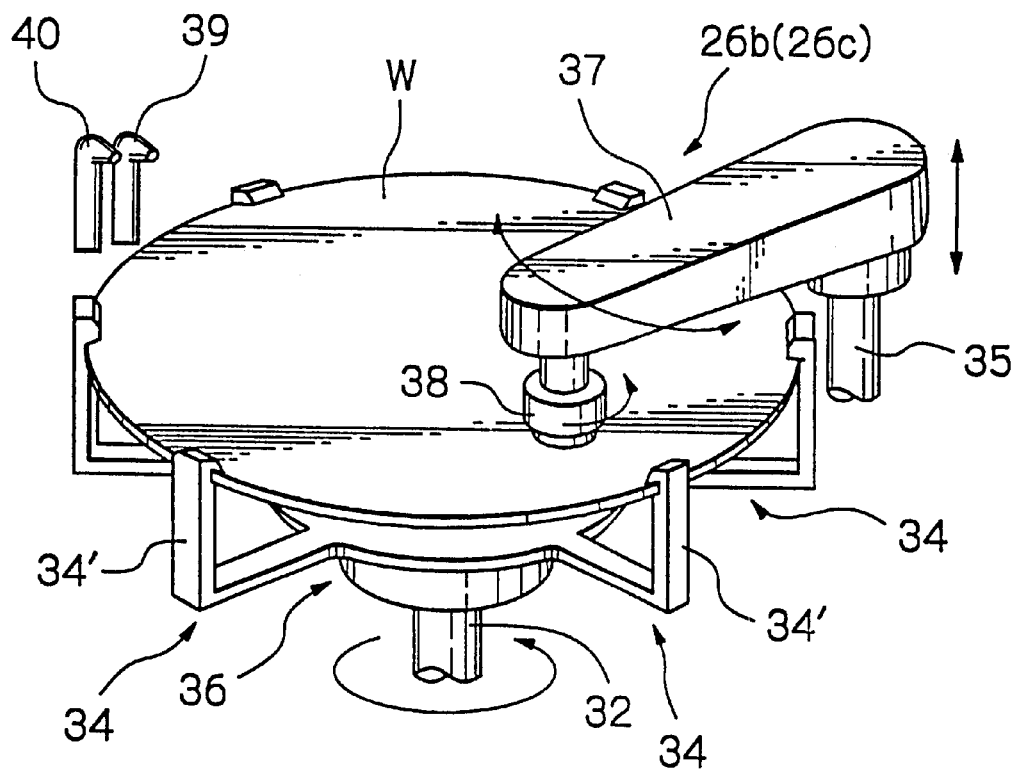
FIG. 8 is a perspective view of another cleaning machine used in the polishing apparatus of FIG. 4.

In FIGS. 1(a)–1(c) and 2(a)–2(b), there is shown a cleaning apparatus in accordance with a first embodiment of the present invention which may be used as the first cleaning machine 26a installed in the polishing apparatus shown in FIG. 4; wherein semiconductor substrates which have been polished in the polishing section 10 of the polishing apparatus are subjected to scrub cleaning.

As shown, the cleaning apparatus includes a plurality of upright substrate support rollers 30 which are radially movable relative to a semiconductor substrate W so that they move between a first position to engage with and support the substrate W and a second position to separate from the substrate. The cleaning apparatus further includes upper and lower scrub cleaning rollers 40a, 40b adapted to move up and down to pinch the substrate W therebetween in a vertical direction to effect scrub cleaning of the substrate W. A pair of pure water nozzles 42, 42 are provided to supply pure water to upper and lower surfaces of the substrate W, and a pair of chemical liquid nozzles 44, 44 are provided to supply a chemical liquid such as an etching liquid to the upper and lower surfaces of the substrate. The scrub cleaning rollers 40a, 40b are preferably made of a sponge member. However, the rollers may include a plurality of radially extending bristles instead of the sponge member, which bristles are arrange in the form of a roller.

Figure 2B:
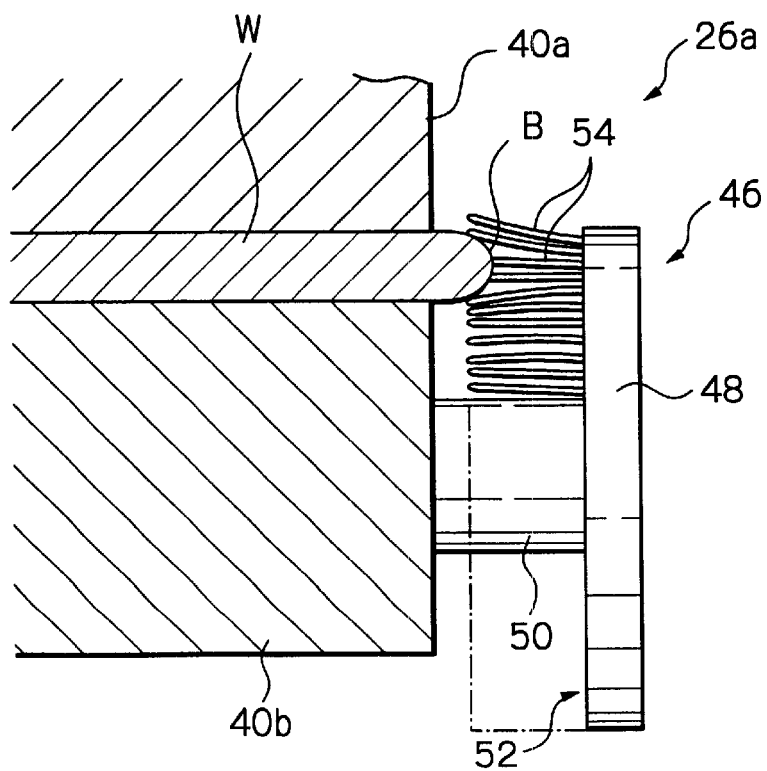
FIG. 2(b) is an enlarged view of a part of FIG. 2(a) showing an edge cleaning device attached to the lower scrub roller.

The lower scrub cleaning roller 40b adapted to be engaged with the lower surface of the substrate is, as most clearly shown in FIGS. 2(a) and 2(b), provided with an edge cleaning member 46. Specifically, the scrub cleaning roller 40b is coaxially formed on a rotatable shaft 50 and the edge cleaning member 46 is provided at the right end (as viewed in FIG. 2) of the shaft 50. During cleaning, the upper and lower scrub cleaning rollers 40a and 40b are brought into contact with the upper and lower surfaces of the substrate, respectively, along a diameter of the substrate in such a manner that the left ends of the rollers, as viewed in FIG. 2(a), extend beyond a peripheral edge A of the substrate W at one extremity of the diameter of the substrate, and the right ends thereof are positioned adjacent to and inside of a peripheral edge B at the other extremity, with only the shaft 50 extending beyond the peripheral edge B. At a tip end of the shaft 50, there is provided the edge cleaning member 46 as a brush consisting of a base member 48 securely connected to the shaft 50 and extending radially therefrom, and bristles 54 made of, for example, mohair provided on an inside surface of the base member 48 and extending towards the scrub cleaning roller 40b to such an extent that tip end portions thereof are in contact with the peripheral edge B of the substrate W. The diameter of the base member 48 is greater than that of the scrub cleaning roller 40b. The edge cleaning member 46 is rotated about an axis along with the scrub cleaning member 40b about the same axis, whereby the bristles 54 of the edge cleaning member 46 are caused to sweep over the peripheral edge B of the substrate. As such, during polishing, as the substrate W is rotated about its vertical axis, the peripheral edge A comes into contact with the bristles 54 and the peripheral edge B comes into contact with the left end portions of the scrub cleaning rollers 40a, 40b, whereby the entire peripheral edge of the substrate W is subjected to edge scrub cleaning effected by the bristles 54, and the entire opposite side surfaces of the substrate W are subjected to scrub cleaning effected by the scrub cleaning rollers 40a, 40b. The edge cleaning member 46 may be provided at the right end of the upper scrub cleaning roller 40a instead of at the right end of the lower scrub cleaning roller 40b. Further, the bristles 54 may be made of materials other than mohair such as a fluorine-containing resin and PVA (Poly Vinyl Alcohol).

Figure 3A:
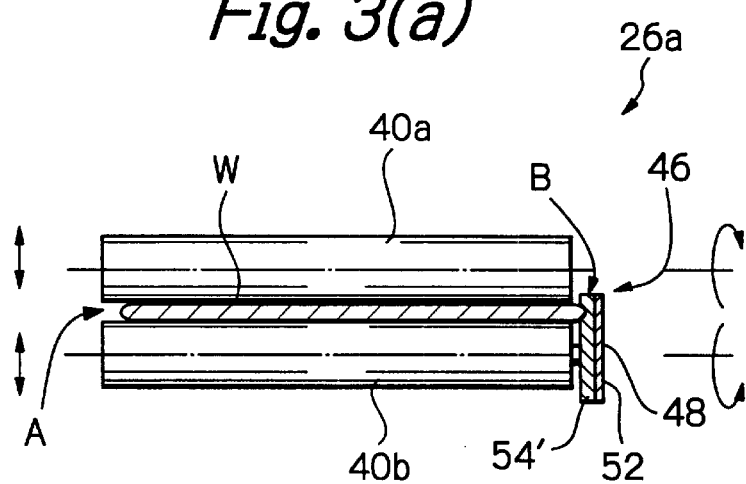
FIG. 3(a) is a side elevation view of upper and lower scrub rollers in operation in accordance with another embodiment of the present invention.
Figure 3B:
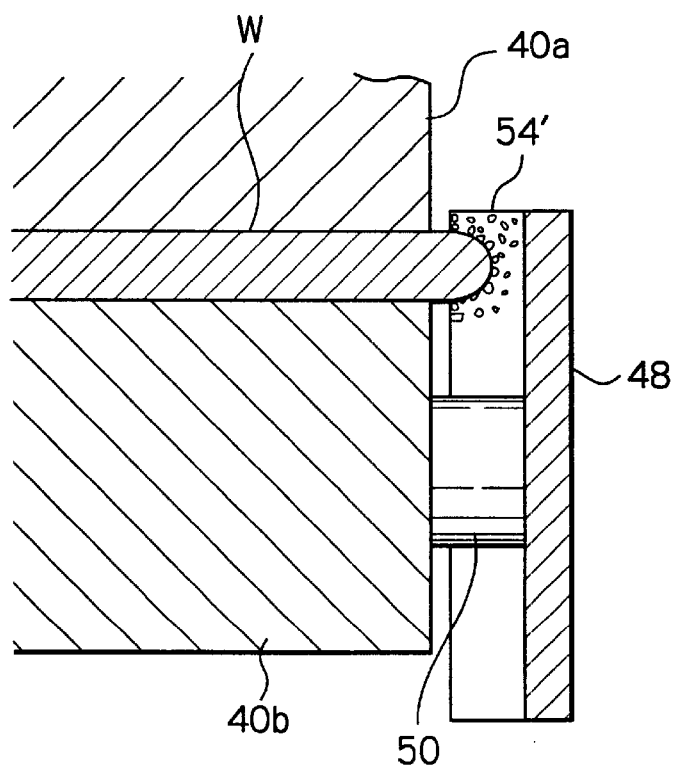
FIG. 3(b) is an enlarged view of a part of FIG. 3(a) showing an edge cleaning device attached to the lower scrub roller.

FIGS. 3(a) and 3(b) show an edge cleaning member 46 comprising a porous sponge member 54' such as a PVA sponge member or a urethane foam sponge member instead of the bristles 54 stated above. The porous sponge member 54' includes a number of fine recesses dispersed over its surface to enhance particle removal. Further, as compared with the brush-type edge cleaning member shown in FIG. 2, the sponge member 54' can be positioned close to the scrub cleaning roller 40b. If the scrub cleaning roller 40b is also made of a sponge material, the scrub cleaning roller 40b and the edge cleaning member 54' may be formed integrally.

In operation, the substrate support rollers 30 are firstly positioned at their retracted or second positions stated above and the scrub cleaning rollers 40a and 40b are moved up and down, respectively, to enable a substrate W, which has been polished and is to be cleaned, to be introduced therebetween in a horizontal fashion. Then, the rollers 30 are radially inwardly moved to finally engage with and hold the substrate W. The rollers 30 are rotated about their own axes to rotate the substrate W at a low speed in a range of from several tens of rpm (preferably about 100) to about 300 rpm and, simultaneously, the scrub cleaning rollers 40a and 40b are engaged with upper and lower surfaces of the substrate W in such a manner as stated above and rotated about their own axes at a low speed, preferably 50 rpm, whereby the substrate W is subjected to both scrub cleaning of its opposite side surfaces and also its peripheral edge. During cleaning, the nozzles 42 supply pure water to the upper and lower surfaces of the substrate. If required, the nozzles 44 are operated to firstly supply an etching liquid or a chemical cleaning liquid to the upper and lower surfaces of the substrate to subject these surfaces to chemical cleaning or etching, thereby removing metallic ions left thereon, and thereafter, the nozzles 42 supply a pure water to the surfaces for removal of the chemical cleaning liquid. It is preferable for the pure water and the chemical cleaning liquid to be supplied to central portions of the upper and lower surfaces in order to be effectively spread over these surfaces. As a chemical cleaning liquid, organic alkalis, for example, TMAH (ammonium system liquid), chelating agent (surfactant or the like) or an organic acid may be used.

When the above-stated cleaning apparatus is used in the polishing apparatus as shown in FIG. 4, following cleaning by the cleaning apparatus as stated above, the substrate W is successively transferred to the second and third cleaning machines 26b and 26c and subjected to final cleaning. Upon completion of the final cleaning in the third cleaning machine 26c, the substrate is rotated at high speed in a range of from around 1500 to 5000 rpm to effect spin drying and, thereafter, is returned to the loading/unloading section 22.

It should be noted that the present invention makes it possible to clean the entire opposite side surfaces and the entire peripheral edge of the substrate, simultaneously, without the need for a complicated mechanism, and remove any particles including abrasive particles and substrate debris from the peripheral edge as well as the opposite side surfaces of the substrate. Accordingly, a yield rate of products using substrates processed by the cleaning apparatus of the present invention is increased.

What is claimed is:

1. A substrate cleaning apparatus comprising:

a side surface cleaning member including a cylindrical scrub cleaning body having a cylindrical surface and opposite ends, said cylindrical scrub cleaning body being adapted to be rotated about an axis thereof while said cylindrical surface thereof is engaged with a side surface of a substrate to be cleaned to effect scrub cleaning of the side surface; and a peripheral edge cleaning member including a sponge member adapted to be engaged with and scrub a peripheral edge of the substrate, said peripheral edge cleaning member being attached to one of said opposite ends of said cylindrical scrub cleaning body so as to be rotated along with said cylindrical scrub cleaning body about the axis of said cylindrical scrub cleaning body.

2. The substrate cleaning apparatus according to claim 1, wherein said side surface cleaning member comprises a rotatable shaft on which said cylindrical scrub cleaning body is coaxially provided, with said rotatable shaft including an end extending beyond said one of said opposite ends of said cylindrical scrub cleaning body, and said peripheral edge cleaning member being attached to said end of said rotatable shaft.

3. The substrate cleaning apparatus according to claim 2, wherein
said peripheral edge cleaning member also includes a base member attached to said end of said rotatable shaft, with said sponge member being provided on a surface of said base member that faces said one of said opposite ends of said cylindrical scrub cleaning body.

4. The substrate cleaning apparatus according to claim 3, wherein
said cylindrical scrub cleaning body comprises a cylindrical sponge member.

5. The substrate cleaning apparatus according to claim 4, wherein
said cylindrical sponge member is integrally formed with said sponge member of said peripheral edge cleaning member.

6. The substrate cleaning apparatus according to claim 5, wherein
said cylindrical sponge member comprises PVA.

7. The substrate cleaning apparatus according to claim 6, wherein
said sponge of said peripheral edge cleaning member comprises PVA.

8. The substrate cleaning apparatus according to claim 7, wherein
said side surface cleaning member is adapted to be placed on the side surface of the substrate to be cleaned in such a manner that the axis of said cylindrical scrub cleaning body is parallel to the side surface of the substrate while said one of said opposite ends of said cylindrical scrub cleaning body is positioned inside the peripheral edge of the substrate, with said peripheral edge cleaning member being positioned outside the peripheral edge of the substrate when said sponge member thereof is engaged with the peripheral edge of the substrate, and the other of said opposite ends of said cylindrical scrub cleaning body being positioned outside the peripheral edge of the substrate, whereby the side surface of the substrate in its entirety and the peripheral edge of the substrate in its entirety are able to be to scrub cleaned.

9. The substrate cleaning apparatus according to claim 5, wherein
said cylindrical sponge member comprises urethane foam.

10. The substrate cleaning apparatus according to claim 9, wherein
said sponge of said peripheral edge cleaning member comprises urethane foam.

11. The substrate cleaning apparatus according to claim 10, wherein
said side surface cleaning member is adapted to be placed on the side surface of the substrate to be cleaned in such a manner that the axis of said cylindrical scrub cleaning body is parallel to the side surface of the substrate while said one of said opposite ends of said cylindrical scrub cleaning body is positioned inside the peripheral edge of the substrate, with said peripheral edge cleaning member being positioned outside the peripheral edge of the substrate when said sponge member thereof is engaged with the peripheral edge of the substrate, and the other of said opposite ends of said cylindrical scrub cleaning body being positioned outside the peripheral edge of the substrate, whereby the side surface of the substrate in its entirety and the peripheral edge of the substrate in its entirety are able to be to scrub cleaned.

12. The substrate cleaning apparatus according to claim 1, wherein
said cylindrical scrub cleaning body comprises a cylindrical sponge member.

13. The substrate cleaning apparatus according to claim 12, wherein
said cylindrical sponge member comprises PVA.

14. The substrate cleaning apparatus according to claim 12, wherein
said cylindrical sponge member comprises urethane foam.

15. The substrate cleaning apparatus according to claim 12, wherein
said cylindrical sponge member is integrally formed with said sponge member of said peripheral edge cleaning member.

16. The substrate cleaning apparatus according to claim 1, wherein
said cylindrical scrub cleaning body comprises PVA.

17. The substrate cleaning apparatus according to claim 1, wherein
said sponge of said peripheral edge cleaning member comprises PVA.

18. The substrate cleaning apparatus according to claim 1, wherein
said cylindrical scrub cleaning body comprises urethane foam.

19. The substrate cleaning apparatus according to claim 1, wherein
said sponge of said peripheral edge cleaning member comprises urethane foam.

20. The substrate cleaning apparatus according to claim 1, wherein
said side surface cleaning member is adapted to be placed on the side surface of the substrate to be cleaned in such a manner that the axis of said cylindrical scrub cleaning body is parallel to the side surface of the substrate while said one of said opposite ends of said cylindrical scrub cleaning body is positioned inside the peripheral edge of the substrate, with said peripheral edge cleaning member being positioned outside the peripheral edge of the substrate when said sponge member thereof is engaged with the peripheral edge of the substrate, and the other of said opposite ends of said cylindrical scrub cleaning body being positioned outside the peripheral edge of the substrate, whereby the side surface of the substrate in its entirety and the peripheral edge of the substrate in its entirety are able to be to scrub cleaned.

* * * * *